United States Patent
Kim et al.

(10) Patent No.: US 10,249,580 B2
(45) Date of Patent: Apr. 2, 2019

(54) STACKED SUBSTRATE INDUCTOR

(71) Applicant: QUALCOMM Incorporated, San Diego, CA (US)

(72) Inventors: Daeik Daniel Kim, Del Mar, CA (US); Changhan Hobie Yun, San Diego, CA (US); David Francis Berdy, San Diego, CA (US); Chengjie Zuo, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/190,158

(22) Filed: Jun. 22, 2016

(65) Prior Publication Data

US 2017/0373025 A1 Dec. 28, 2017

(51) Int. Cl.
| | |
|---|---|
| *H01L 23/64* | (2006.01) |
| *H01F 41/04* | (2006.01) |
| *H01L 23/522* | (2006.01) |
| *H01L 23/498* | (2006.01) |
| *H01L 23/538* | (2006.01) |
| *H01L 25/16* | (2006.01) |
| *H01L 27/08* | (2006.01) |

(52) U.S. Cl.
CPC ......... *H01L 23/645* (2013.01); *H01F 41/041* (2013.01); *H01L 23/49822* (2013.01); *H01L 23/5227* (2013.01); *H01L 23/5383* (2013.01); *H01L 25/16* (2013.01); *H01L 2224/16227* (2013.01); *H01L 2924/19042* (2013.01); *H01L 2924/19105* (2013.01)

(58) Field of Classification Search
CPC .................................................. H01L 23/5227
USPC .................................. 438/57; 257/422, 531
See application file for complete search history.

(56) References Cited

U.S. PATENT DOCUMENTS

| | | | |
|---|---|---|---|
| 7,721,414 B2 | 5/2010 | Sia et al. | |
| 8,471,358 B2 | 6/2013 | Yen et al. | |
| 8,519,815 B1 | 8/2013 | Sanders | |
| | (Continued) | | |

FOREIGN PATENT DOCUMENTS

JP 2016100451 A 5/2016

OTHER PUBLICATIONS

International Search Report and Written Opinion—PCT/US2017/036510—ISA/EPO—dated Sep. 13, 2017.

*Primary Examiner* — Calvin Lee
(74) *Attorney, Agent, or Firm* — Muncy, Geissler, Olds & Lowe, P.C./Qualcomm (57) ABSTRACT

In conventional device packages, separate standalone inductors are provided and mounted on an interposer substrate along with a die. Separate inductors reduce integration density, decrease flexibility, increase footprint, and generally increase costs. To address such disadvantages, it is proposed to provide a part of an inductor in a substrate below a die. The proposed stacked substrate inductor may include a first inductor in a first substrate, a second inductor in a second a second substrate stacked on the first substrate, and an inductor interconnect coupling the first and second inductors. The core regions of the first and second inductors may overlap with each other at least partially. The proposed stacked substrate inductor may enhance integration density, increase flexibility, decrease footprint, and/or reduce costs.

28 Claims, 8 Drawing Sheets

(56) References Cited

U.S. PATENT DOCUMENTS

| | | | |
|---|---|---|---|
| 8,823,133 B2 | 9/2014 | Jenkins et al. | |
| 9,147,518 B1 | 9/2015 | Nakamura et al. | |
| 9,634,714 B2 * | 4/2017 | Murayama | H04B 1/40 |
| 2013/0168809 A1 | 7/2013 | Yen et al. | |
| 2015/0130021 A1 | 5/2015 | Kim et al. | |
| 2017/0062119 A1 * | 3/2017 | Zybura | H01F 17/0013 |

* cited by examiner

CONVENTIONAL ART

FIG. 1A

CONVENTIONAL ART

STACKED SUBSTRATE INDUCTOR

FIELD OF DISCLOSURE

The field of the disclosed subject matter generally relates to devices and to methods of manufacturing the devices. In particular, the field of the disclosed subject matter relates to stacked substrate inductors and to device packages incorporating the stacked substrate inductors.

BACKGROUND

Figure 1A:
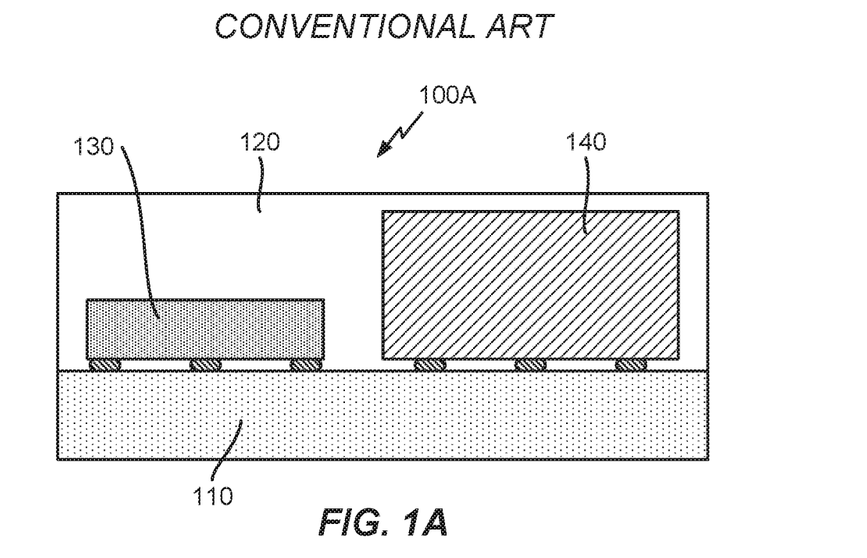
FIGS. 1A and 1B illustrate examples of conventional device packages.
Figure 1B:
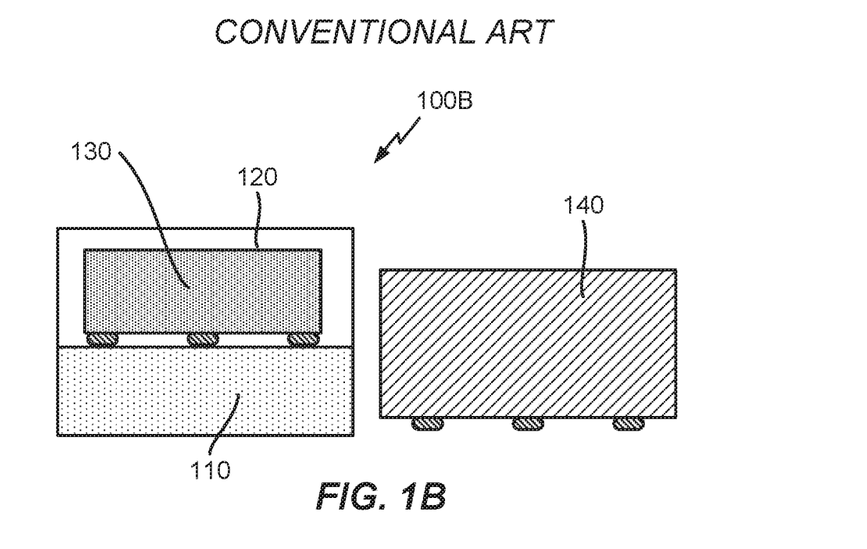

In devices for radio frequency (RF) applications and power applications among others, inductors are used. Inductors can help to minimize power fluctuations and thereby increase stability such as in chipset power supply. It is often desirable to integrate inductors in device packages such as power management integrated circuits (PMIC). FIG. 1A illustrates a conventional PMIC 100A. As seen, the conventional PMIC 100A includes an interposer substrate 110 with a die substrate 120 mounted thereon. Also, a die 130 and a surface mount device (SMD) power inductor 140 are provided within the die substrate 120. FIG. 1B illustrates another conventional PMIC 100B. The difference between FIGS. 1A and 1B is that in FIG. 1A, the SMD power inductor 140 is mounted on the interposer substrate 110 while in FIG. 1B, the SMD power inductor 140 is provided as a standalone device.

But in both conventional devices, a separate SMD power inductor 140 is provided. Having a separate inductor can reduce integration density, decrease flexibility, increase total footprint, and increase costs, among others. Also, when the separate SMD power inductor 140 is mounted on the interposer substrate 110 such as in FIG. 1A, a total height of the device package 100A increases.

SUMMARY

This summary identifies features of some example aspects, and is not an exclusive or exhaustive description of the disclosed subject matter. Whether features or aspects are included in, or omitted from this Summary is not intended as indicative of relative importance of such features. Additional features and aspects are described, and will become apparent to persons skilled in the art upon reading the following detailed description and viewing the drawings that form a part thereof.

An exemplary stacked substrate inductor is disclosed. The example stacked substrate inductor may include a first substrate, a second substrate stacked on the first substrate, a first inductor within the first substrate, and a second inductor within the second substrate. The stacked substrate inductor may also include an inductor interconnect within the first substrate and/or the second substrate. The inductor interconnect may electrically couple the first inductor with the second inductor. A core region of the first inductor may be referred to as a first core region, and a core region of the second inductor may be referred to as a second core region. At least a portion of the first core region may overlap with at least a portion of the second core region.

An exemplary device package is disclosed. The example device package may include a first substrate, a second substrate stacked on the first substrate, a first inductor within the first substrate, a die within the second substrate, and a second inductor also within the second substrate. The device package may also include an inductor interconnect within the first substrate and/or the second substrate. The inductor interconnect may electrically couple the first inductor with the second inductor. A core region of the first inductor may be referred to as a first core region, and a core region of the second inductor may be referred to as a second core region. At least a portion of the first core region may overlap with at least a portion of the second core region.

An exemplary method of manufacturing a device package is disclosed. The method may include providing a first substrate, providing a first inductor within the first substrate, stacking a second substrate on the first substrate, and providing a die and a second inductor within the second substrate. The method may also include providing an inductor interconnect within the first substrate and/or the second substrate so as to electrically couple the first inductor with the second inductor. A core region of the first inductor may be referred to as a first core region, and a core region of the second inductor may be referred to as a second core region. In the method, the first and second inductors may be provided such that at least a portion of the first core region overlaps with at least a portion of the second core region.

BRIEF DESCRIPTION OF THE DRAWINGS

The accompanying drawings are presented to aid in the description of examples of one or more aspects of the disclosed subject matter and are provided solely for illustration of the examples and not limitation thereof.

DETAILED DESCRIPTION

Aspects of the subject matter are provided in the following description and related drawings directed to specific examples of the disclosed subject matter. Alternates may be devised without departing from the scope of the disclosed subject matter. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments of the disclosed subject matter include the discussed feature, advantage or mode of operation.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, processes, operations, elements, and/or components, but do not preclude the presence or addition of one or more other features, integers, processes, operations, elements, components, and/or groups thereof.

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects may be embodied in a number of different forms, all of which have been contemplated to be within the scope of the claimed subject matter. In addition, for each of the examples described herein, the corresponding form of any such examples may be described herein as, for example, "logic configured to" perform the described action.

As indicated above, in a conventional device package, a separate SMD power inductor is provided, which reduces integration density, decreases flexibility, increases total footprint, and generally increases costs. Also, when the separate SMD power inductor is mounted on the interposer substrate, a total height of the device package increases.

Figure 2:
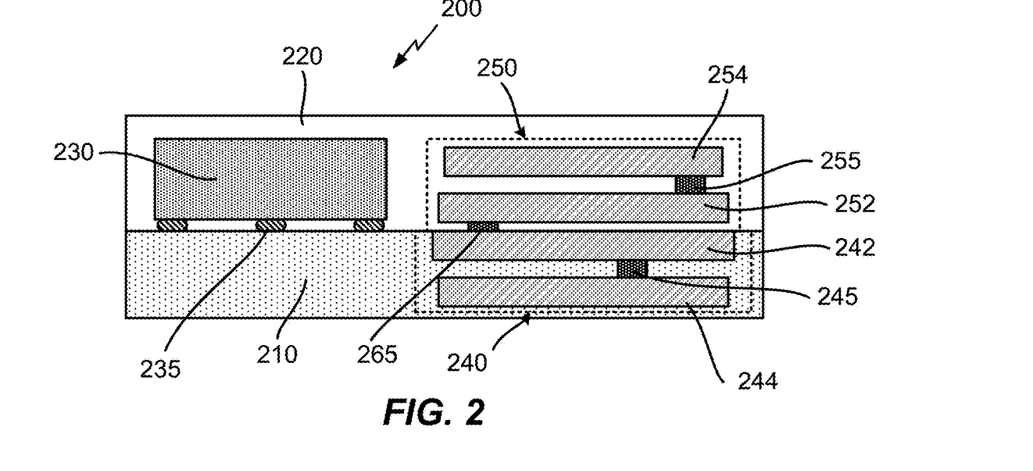
FIG. 2 illustrates a side view of an example device package with a stacked substrate inductor.

However, in an aspect, it is proposed to provide a stacked substrate inductor. FIG. 2 illustrates a side view of an example of a device package 200 with a stacked substrate inductor. The device package 200 may include a first substrate 210, a second substrate 220 stacked on the first substrate 210. An interposer substrate may be an example of the first substrate 210, and a die substrate may be an example of the second substrate 220. The device package 200 may also include a die 230 within the second substrate 220. The die 230 may be coupled to electrical circuits such as redistribution layers (RDLs) formed within the first substrate 210 (not shown) through die bumps 235. In a flip chip (FC) assembly, the die bumps 235 may be flip chip bumps.

The device package 200 may further include a first inductor 240 within the first substrate 210 and a second inductor 250 within the second substrate 220. The first and second inductors 240, 250 may be viewed as examples of means for providing a first inductance and as means for providing a second inductance, respectively. An inductor interconnect 265 may electrically couple the first inductor 240 with the second inductor 250. The inductor interconnect 265 may be viewed as an example of means for providing an interconnect for electrically coupling the first and second inductors 240, 250. The inductor interconnect 265 may be formed within the first substrate 210 and/or formed within the second substrate 220. For example, in a flip chip assembly, the inductor interconnect 265 may also be a flip chip bump. The first and second inductors 240, 250 may be stacked vertically. When the stacked first and second inductors 240, 250 are electrically coupled to each other, e.g., by the inductor interconnect 265, the first and second inductors 240, 250 together may form a single stacked substrate inductor.

In an embodiment, a core region (i.e., a center region) of the first inductor 240 may be aligned, at least partially, with a core region of the second inductor 250. In an aspect, the alignment may be described as follows. For simplicity, the core regions of the first and second inductors 240, 250 will be respectively referred to as first and second core regions. When at least a portion of the first core region overlaps with at least a portion of the second core region, then it may be said that the first and second core regions are at least partially aligned. Greater the alignment, more optimal inductance can result from the stacked substrate inductor.

In FIG. 2, the first inductor 240 is illustrated as including two inductance loops 242, 244. For simplicity, the inductance loops 242, 244 will respectively be referred to as the first substrate first inductance loop 242 and the first substrate second inductance loop 244. While two first substrate inductance loops 242, 244 are illustrated, the number of first substrate inductance loops can be any number, i.e., the first inductor 240 may include one or more inductance loops. Each of the first substrate inductance loops 242, 244 may be viewed as an example of a first loop inductance. In such instances, the means for providing the first inductance may be viewed as comprising means for providing one or more first loop inductances.

In an aspect, when there is a plurality of first substrate inductance loops 242, 244, i.e., two or more, then the first substrate inductance loops 242, 244 may be formed at different levels. In other words, it may be that none of the first substrate inductance loops 242, 244 circumscribes another of the first substrate inductance loops 242, 244 at any given level. For example, FIG. 2 illustrates that the first substrate first inductance loop 242 and the first substrate second inductance loop 244 are at different levels, i.e., at different heights. Thus, neither of the first substrate inductance loops 242, 244 may circumscribe the other at a given level.

Also when there is the plurality of first substrate inductance loops 242, 244 (e.g., when the means for providing the first inductance comprises means for providing a plurality of first loop inductances), then between each pair of adjacent first substrate inductance loops 242, 244, a corresponding first substrate loop interconnect 245 may electrically couple the adjacent first substrate inductance loops 242, 244. For example, FIG. 2 illustrates that the first substrate first inductance loop 242 and the first substrate second inductance loop 244 may be electrically coupled by the first substrate loop interconnect 245. Each first substrate loop interconnect 245 may be viewed as an example of means for providing an interconnect for electrically coupling adjacent pair of first loop inductances. In an aspect, the first substrate loop interconnect 245 may be a conductive via.

Similarly, the second inductor 250 may include any number, i.e., one or more, of second substrate inductance loops 252, 254. For simplicity, these may be referred to as second substrate first inductance loop 252 and the second substrate second inductance loop 254. Note that the number of second substrate inductance loops 252, 254 may be independent of the number of first substrate inductance loops 242, 244, i.e., they may be same or different. Each of the second substrate inductance loops 252, 254 may be viewed as an example of a second loop inductance. In such instances, the means for providing the second inductance may be viewed as comprising means for providing one or more second loop inductances.

When there is a plurality of second substrate inductance loops 252, 254, they may be at different levels such that none of the second substrate inductance loops 252, 254 circumscribes another of the second substrate inductance loops 252, 254 at any given level. Also when there is the plurality of second substrate inductance loops 252, 254 (e.g., when the means for providing the second inductance comprises means for providing a plurality of second loop inductances), then between each pair of adjacent second substrate inductance loops 252, 254, a corresponding second substrate loop interconnect 255 may electrically couple the adjacent second substrate inductance loops 252, 254. Each of the second substrate loop interconnect 255 may be viewed as an example of means for providing an interconnect for electrically coupling adjacent pair of first loop inductances. In an aspect, the second substrate loop interconnect 255 may be a conductive via.

One advantage (of which there can be several) of the device package 200 of FIG. 2 is that the height of the device package 200 can be made to be short. Recall that in FIG. 1A, providing the separate SMD power inductor 140 on the interposer substrate 110 increases the total height of the conventional package 100A. This is because the height of the SMD power inductor 140 can be substantially greater than the die 130.

But as seen in FIG. 2, the overall height of the device package 200 may be reduced. For example, the height of the stacked substrate inductor may be at or below the height of the die 230. That is, the height of the second inductor 250 may be less than or substantially equal to the height of the die 230. When a part of the stacked substrate inductor is provided in the first substrate 210 (e.g., the first inductor 240), the overall height of the device package 200 may be reduced while still providing high inductance. For example, the stacked substrate inductor of the device package 200 may provide similar or even greater inductance than the conventional SMD power inductor 140.

Figure 3:
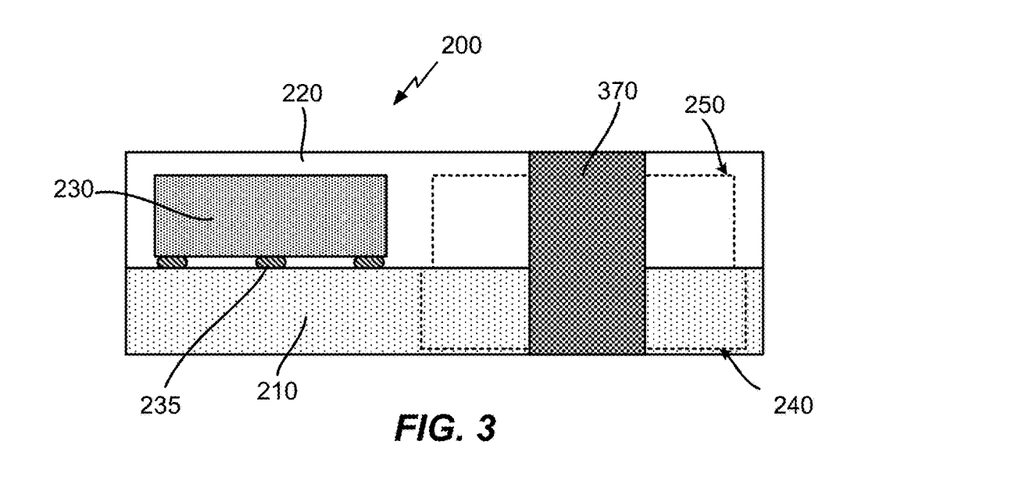
FIG. 3 illustrates a side view of an example device package integrated with a magnetic core.

Optionally, a magnetic core 370 may be incorporated in the device package 200 as illustrated in FIG. 3. So as to minimize clutter, the outlines of the first and second inductors 240, 250 are included in the figure, but the substrate inductance loops 242, 244, 252, 254 of the first and second inductors 240, 250 are not included. FIG. 3 shows that the magnetic core 370 may occupy both first and second core regions. But this is only a particular example implementation and not a limitation. When the magnetic core 370 is present, it may occupy any portion of the first core region and/or any portion of the second core region. When the magnetic core 370 occupies portions of both the first and second core regions through both the first and second substrates 210, 220 as shown in the figure, the magnetic core 370 may also be referred to as a "through-package" core.

Figure 4:
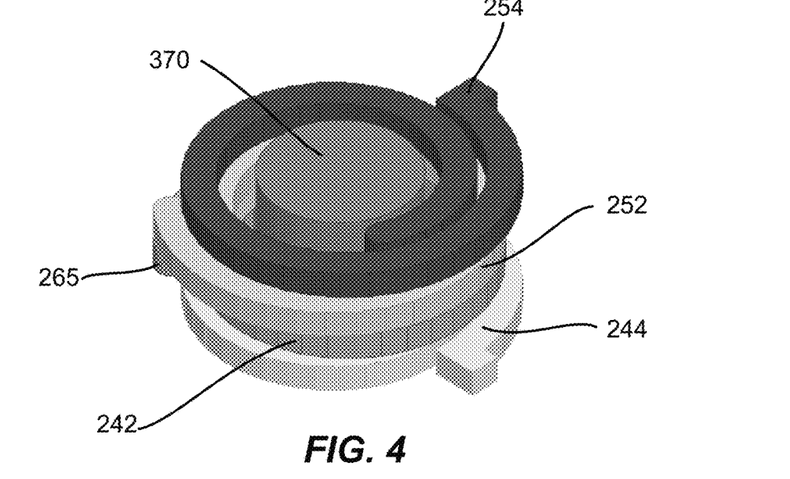
FIG. 4 illustrates a perspective view of an example stacked substrate inductor.

In an aspect, the first inductor 240 and/or the second inductor 250 may be looped substantially in a spiral. For example, any or all of the first substrate inductance loops 242, 244 and/or any or all of the second substrate inductance loops 252, 254 may be looped substantially in spirals. This is illustrated in FIG. 4 which shows a perspective view of an example stacked substrate inductor. For simplicity and to minimize clutter, the first and second substrates 210, 220 and the die 230 are not included. FIG. 4 also shows the optional magnetic core 370 in the first and second core regions.

Figure 5:
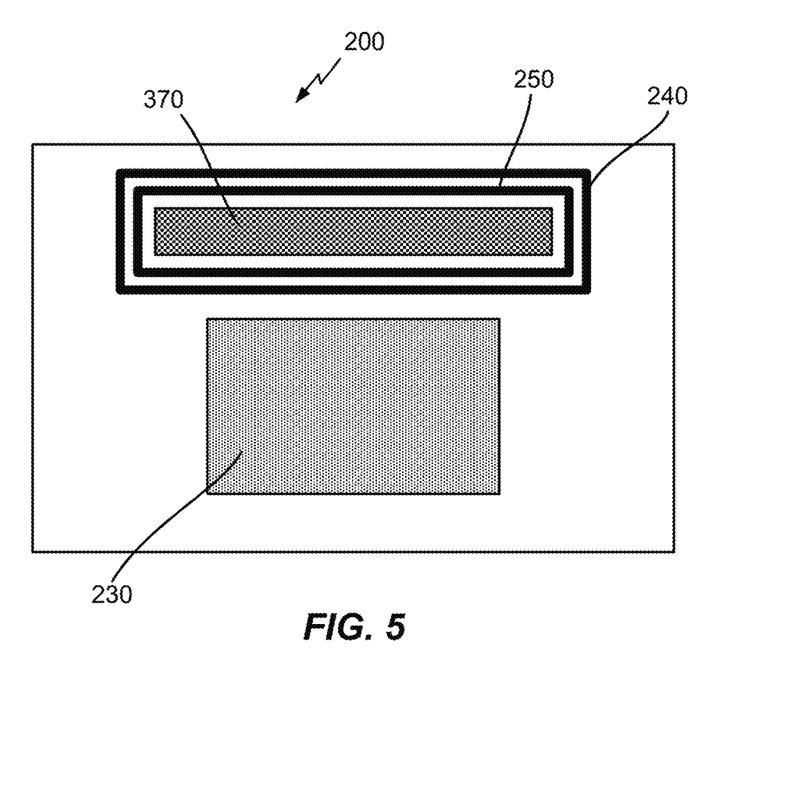
FIG. 5 illustrates a top view of an example device package with a stacked substrate inductor.

Spirals are merely one of many arbitrary shapes for the stacked substrate inductor. The first and/or second inductors 240, 250 may be looped in a variety of shapes. For example, FIG. 5 illustrates a top view of another example of a device package 200 with a stacked substrate inductor that includes the first and second inductors 240, 250. For simplicity and to minimize clutter, only the loop shapes of the first and second inductors 240, 250 are shown. As seen, the first inductor 240 and/or the second inductor 250 may be looped substantially in a rectangular shape. In other words, the first substrate inductance loops 242, 244 and/or the second substrate inductance loops 252, 254 may have substantially rectangular shapes. The device package 200 may also include the optional magnetic core 370, which may also be rectangular shaped substantially. This illustrates that when the magnetic core 370 is provided, it may be shaped in accordance with the loop shapes of the first and/or second inductors 240, 250.

As an aside, recall that in an aspect, the first and second core regions may overlap at least partially. FIG. 5 illustrates an example of this aspect. Viewed from the top, it is seen that the first core region (region inside of the first inductor 240) completely overlaps the second core region (region inside of the second inductor 250). Again, this is an example implementation. The overlap between the first and second regions can be partial.

Figure 6:
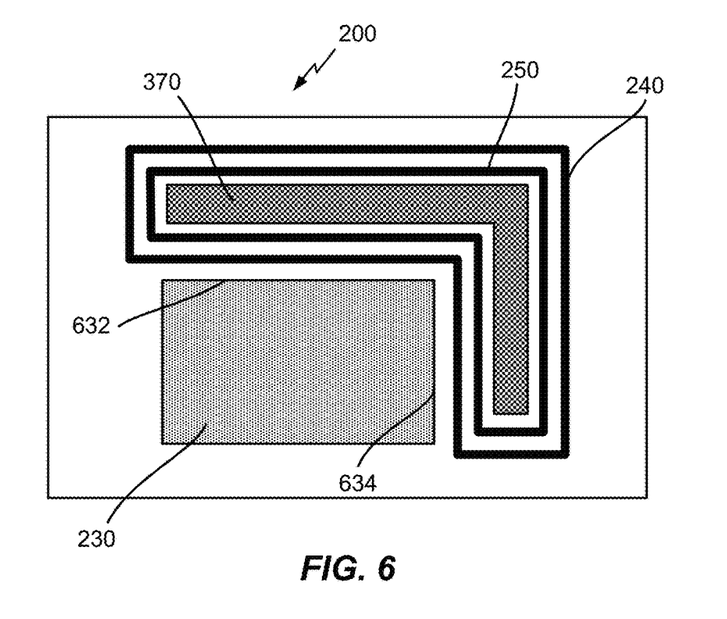
FIG. 6 illustrates a top view of another example device package with a stacked substrate inductor.

Going back to the discussion of inductor loop shapes, it is mentioned above that the first and/or the second inductors 240, 250 may looped in an arbitrary shape. For example, FIG. 6 illustrates a top view of another device package 200 with "L" shaped inductance loops. That is, the first substrate inductance loops 242, 244 and/or the second substrate inductance loops 252, 254 may be looped in the "L" shape substantially. Again, the device package 200 may also include the optional magnetic core 370, and the magnetic core 370 may be shaped in accordance with loop shapes of the first substrate inductance loops 242, 244 and/or the second substrate inductance loops 252, 254.

This capability to arbitrarily shape the first and/or the second inductors 240, 250 is advantageous in that one or both of the first and second inductors 240, 250 can be shaped to conform, at least to some degree, to the shape and location of the die 230. For example, the "L" shape allows the first and second inductors 240, 250 to be located adjacent to a periphery of first and second sides 632, 634 of the die 230. This allows the stacked substrate inductor of the device package 200 to be located closer to the die 230 to a greater extent than the standalone SMD power inductor 140 of the conventional package 100A, 100B. As a result, the foot print of the device package 200 can be reduced relative to the conventional package 100A, 100B. In an aspect, the first and second sides 632, 634 may be any two consecutive sides of the die 230 with a corner (i.e., angle not equal to 180°) therebetween.

Figure 7:
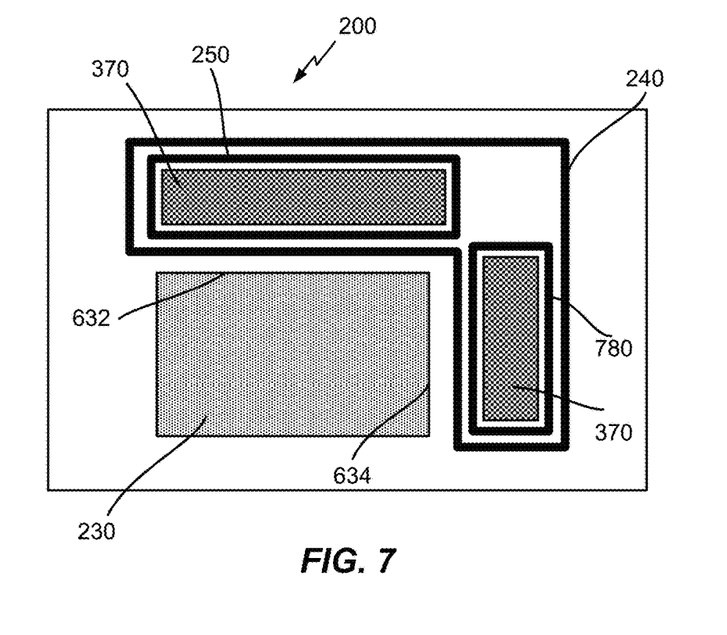
FIG. 7 illustrates a top view of a further example device package with a stacked substrate inductor.

In FIGS. 2-6, the stacked substrate inductor is illustrated as including one inductor in the first substrate (e.g., the first inductor 240) and one inductor in the second substrate (e.g., the second inductor 250). However, the number of inductors in each of the substrates can be any number. For example, FIG. 7 illustrates a top view of a further example of a device package. In the first substrate 210, the first substrate inductance loops 242, 244 may be looped in the "L" shape substantially similar to the package of FIG. 6. In this way, the first inductor 240 may be located adjacent to the periphery of the first and second sides 632, 634 of the die 230.

In the second substrate 220, the second inductor 250 may be located adjacent to the periphery of the first side 632 of the die 230 similar to FIG. 5. But as seen in FIG. 7, the device package 200 may also include a third inductor 780 in the second substrate 220 and located adjacent to the periphery of the second side 634 of the die 230. While the second and third inductors 250, 780 are illustrated as being looped substantially in rectangular shapes, the shapes may be arbitrary. The device package 200 may also include one or more optional magnetic cores 370, and each magnetic core 370, when provided may be shaped in accordance with the loop shape of the second inductor 250 and/or the loop shape of the third inductor 780.

In an embodiment, a core region of the third inductor 780 may at least partially overlap with the first core region. That is, at least a portion of the third core region may overlap with at least a portion of the first core region. However, the second and third core regions themselves may or may not overlap each other. In FIG. 7, they are illustrated as non-overlapping.

The third inductor 780 may be electrically coupled to the first inductor 240, e.g., with another inductor interconnect (not shown). That is, the second and third inductors 250, 780 may be electrically coupled such that they are electrically in parallel with each other and electrically in series with the first inductor 240. Alternatively, the third inductor 780 may be electrically coupled to the second inductor 250 such that the first, second, and third inductors 240, 250, 780 are electrically in series.

While not shown, the third inductor 780 may share common traits with the second inductor 250. For example, the third inductor 780 may include one or more inductance loops. When the third inductor 780 includes a plurality of inductance loops, a loop interconnect (e.g., a conductive via) may electrically couple each adjacent pair of the inductance loops of the third inductor 780. Also when there is the plurality of inductance loops, each inductance loop of the third inductor 780 may be at different levels such that no inductance loop of the third inductor 780 circumscribes another inductance loop of the third inductor 780. Further, the height of the third inductor 780 may be less than or substantially equal to the height of the die 230.

Figure 8A:
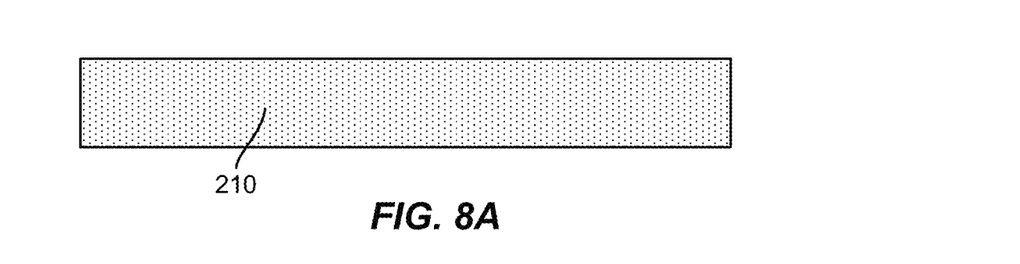
FIGS. 8A-8F illustrate examples of different stages of manufacturing a device package with a stacked substrate inductor.
Figure 8B:
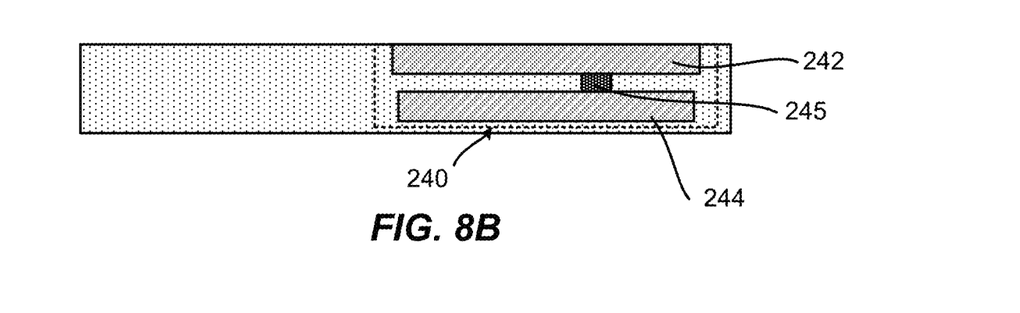

FIGS. 8A-8F illustrate some of the processing stages of manufacturing a device package with a stacked substrate inductor. FIG. 8A illustrates a stage in which the first substrate 210, e.g., an interposer substrate, is provided. FIG. 8B illustrates a stage in which the first inductor 240 is provided in the first substrate 210. For example, the first substrate 210 may be selectively etched and filled with conductive material to form the one or more first substrate inductance loops 242, 244. When more than one first substrate inductance loops 242, 244 are provided, they may be coupled with the first substrate loop interconnect 245.

Figure 8C:
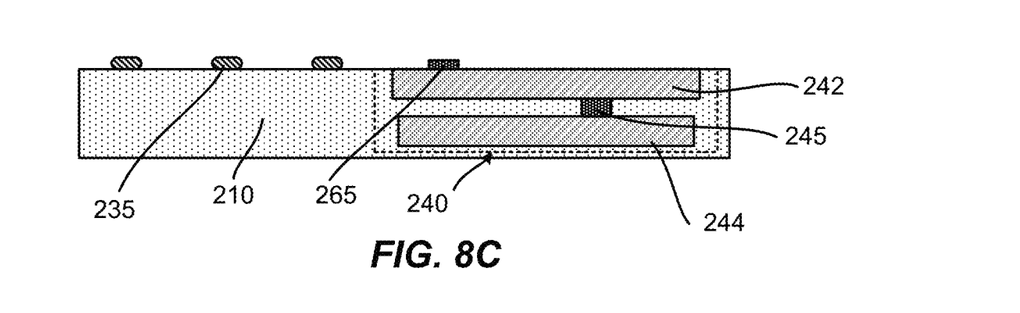

FIG. 8C illustrates a stage in which the inductor interconnect 265 is provided on the first substrate 210 and coupled to the first inductor 240. The die bumps 235 may also be provided on the first substrate 210. In an aspect, the inductor interconnect 265 and/or the die bumps 235 may be formed as flip chip bumps. While not shown, the inductor interconnects for other inductors such as the third inductor 780 may also be provided.

Figure 8D:
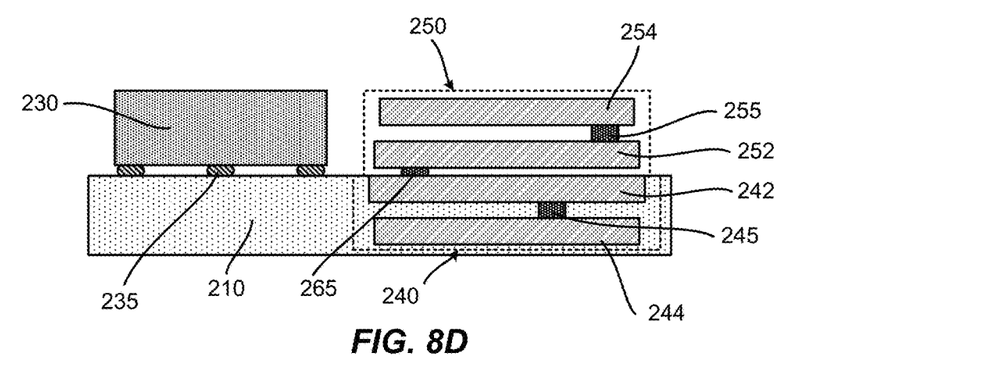

FIG. 8D illustrates a stage in which the second inductor 250 is placed on the first substrate 210 and aligned with the inductor interconnect 265 such that the first and second inductors 240, 250 are coupled. The die 230 may also be placed on the first substrate 210 and aligned with the die bumps 235. Reflow and underfill processes may be performed as desired to ensure proper electrical coupling and to provide mechanical support. While not shown, this may also be the stage in which other inductors such as the third inductor 780 is provided.

Figure 8E:
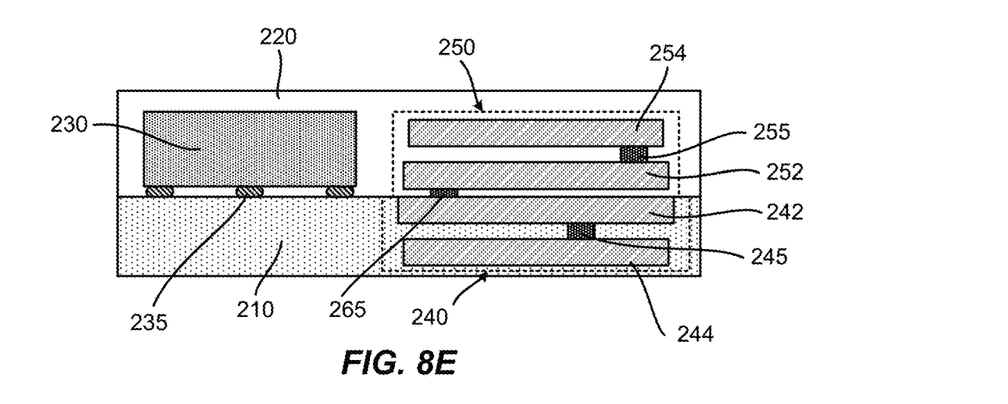

FIG. 8E illustrates a stage in which the second substrate 220 is provided. For example, a mold may be formed on the first substrate 210 so as to encapsulate the die 230 and the second inductor 250. If there are other inductors such as the third inductor 780, these other inductors may also be encapsulated. The mold then may be planarized to a desired height to form the second substrate 220.

Figure 8F:
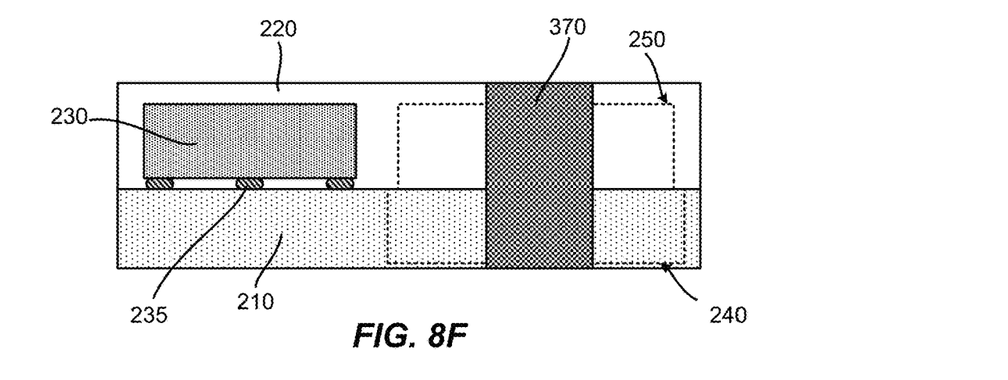

The manufacturing process may finish at the stage illustrated in FIG. 8E. But recall that optionally, the magnetic core 370 may be provided. This optional stage is illustrated in FIG. 8F. Again to minimize clutter, the outlines of the first and second inductors 240, 250 are included, but not their respective inductance loops. The magnetic core 370 may be formed by selective etching of the first and second core regions and filling the etched regions with a magnetic core material.

Figure 9:
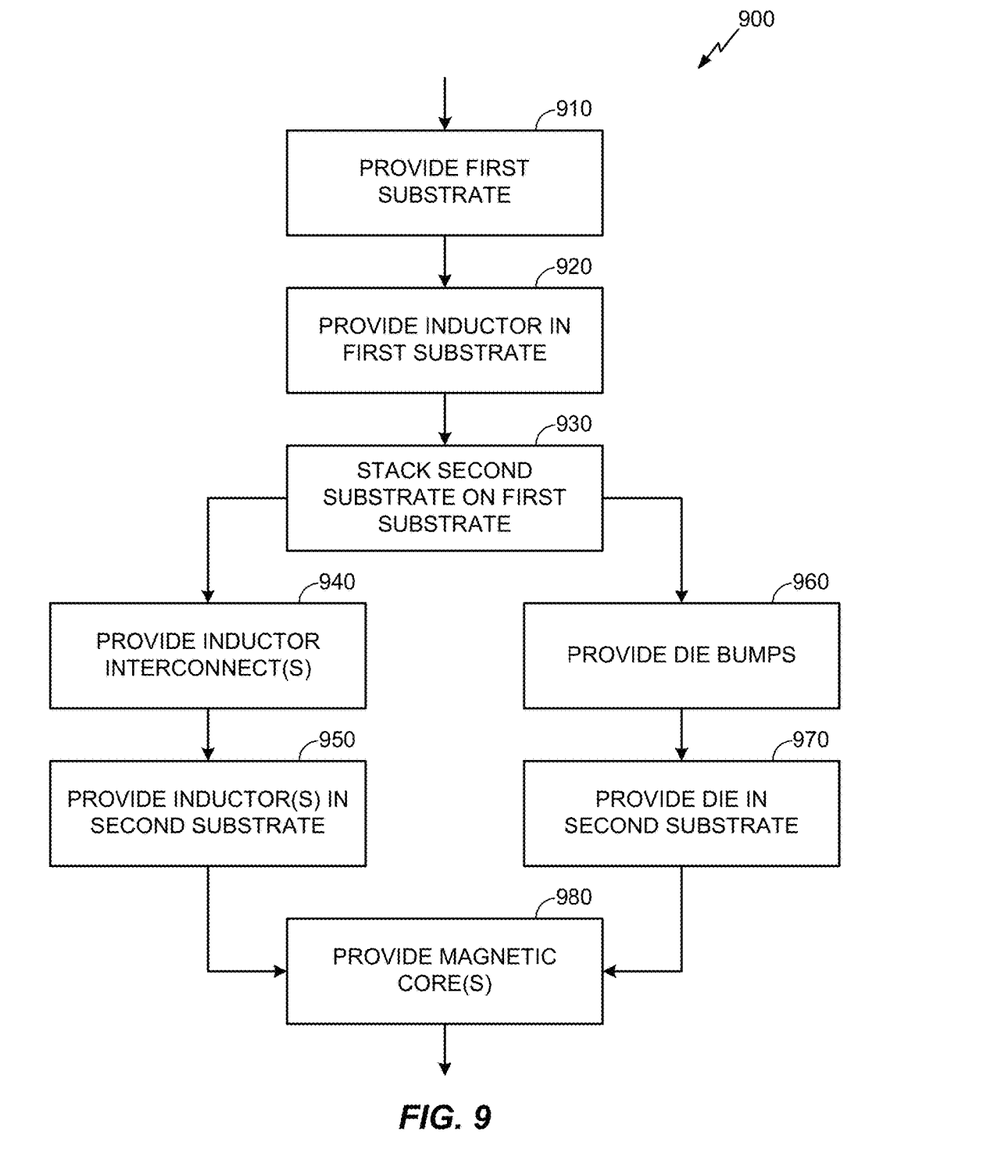
FIG. 9 illustrates a flow chart of an example method of manufacturing a device package with a stacked substrate inductor.

FIG. 9 illustrates a flow chart of an example method 900 of manufacturing a device package with a stacked substrate inductor. It should be noted that not all illustrated blocks of FIG. 9 need to be performed, i.e., some blocks may be optional. Also, the numerical references to the blocks in FIG. 9 should not be taken as requiring that the blocks should be performed in a certain order.

In block 910, the first substrate 210 may be provided. FIG. 8A is illustrative of this block. In block 920, the first inductor 240 may be provided in the first substrate 210. FIG. 8B is illustrative of this block. In block 930, the second substrate 220 may be stacked on the first substrate 210. In block 940, the inductor interconnects 265 may be provided. In block 950, the second inductor 250 may be provided in the second substrate 220. Along with forming the inductor interconnects 265, the die bumps 235 may be provided in block 960. Then in block 970, the die 230 may be provided in the second substrate 220. FIGS. 8C-8E are illustrative of blocks 930-970.

Figure 10:
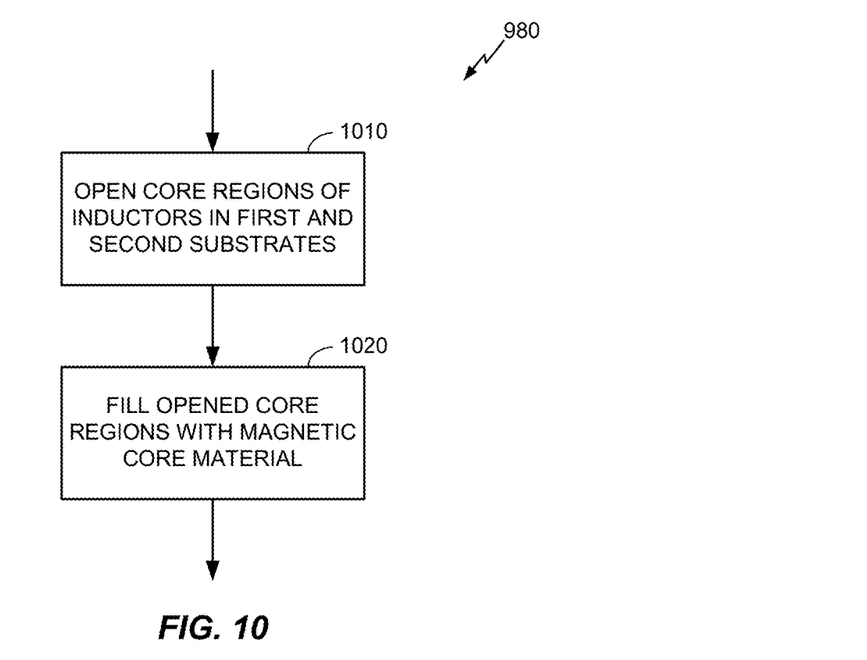
FIG. 10 illustrates a flow chart of an example process of providing a magnetic core in a stacked substrate inductor.

Optionally, in block 980, the magnetic core 370 may be provided. FIG. 8F is illustrative of this block. FIG. 10 illustrates a flow chart of an example process of providing the magnetic core 370. In block 1010, the core regions of inductors in the first and second substrates 210, 220 may be opened. For example, the regions of the first and second substrates 210, 220 corresponding to the first and second core regions may be selectively etched. Then in block 1020, the opened regions may be filled with the magnetic core material.

Referring back to FIG. 9, it should be noted that the inductor interconnects for other inductors in the second substrate 220 and the inductors, such as the third inductor 780, may also be provided in blocks 940 and 950. In addition, if desired, the magnetic core 370 in the third core region may also be provided in block 980.

Figure 11:
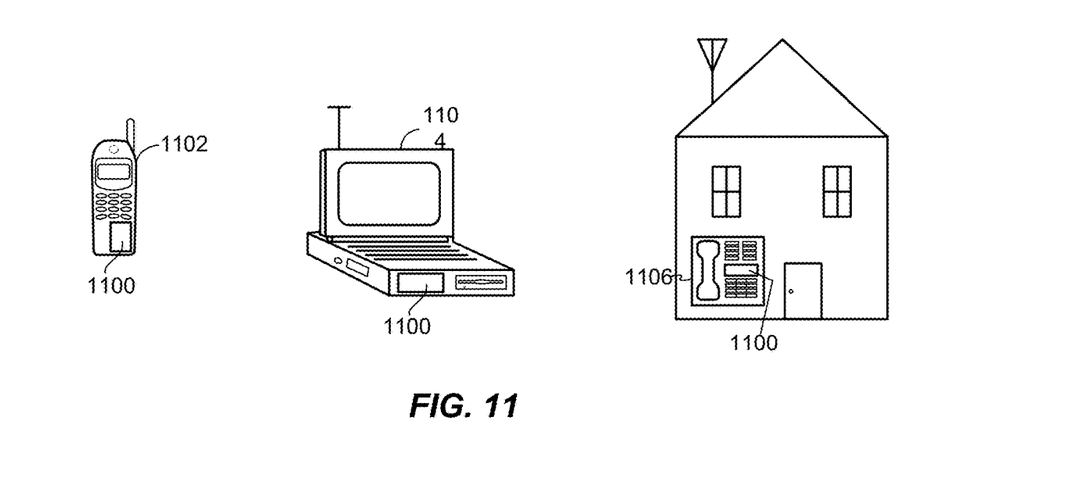
FIG. 11 illustrates examples of devices with a stacked substrate inductor integrated therein.

FIG. 11 illustrates various electronic devices that may be integrated with any of the aforementioned device packages 200. For example, a mobile phone device 1102, a laptop computer device 1104, and a fixed location terminal device 1106 may include a device package 1100 as described herein. The device package 1100 may be, for example, any of the integrated circuits, dies, integrated devices, integrated circuit devices, device packages, semiconductor devices, package-on-package devices, and so on. The devices 1102, 1104, 1106 illustrated in FIG. 11 are merely exemplary. Other electronic devices may also feature the semiconductor device 600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed subject matter.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the disclosed subject matter can include a computer readable media embodying a method for manufacturing a device package. Accordingly, the scope of the disclosure is not limited to illustrated examples and any means for performing the functionality described herein are included in the scope.

While the foregoing disclosure shows illustrative embodiments, it should be noted that various changes and modifications could be made herein without departing from the scope as defined by the appended claims. The functions, steps and/or actions of the method claims in accordance with the embodiments and aspects described herein need not be performed in any particular order. Furthermore, although elements of the disclosure may be described or claimed in the singular, the plural is contemplated unless limitation to the singular is explicitly stated.

What is claimed is:

1. A stacked substrate inductor, comprising:
   a first substrate;
   a second substrate stacked on the first substrate such that an upper side of the first substrate is in direct contact with a lower side of the second substrate;
   a first inductor within and in direct contact with the first substrate, the first inductor including a first core region;
   a second inductor within and in direct contact with the second substrate, the second inductor including a second core region;
   an inductor interconnect within and in direct contact with the second substrate, the inductor interconnect configured to electrically couple the first inductor with the second inductor,
   wherein at least a portion of the first core region overlaps with at least a portion of the second core region,
   wherein the second inductor comprises a plurality of second substrate inductance loops, and
   wherein the second substrate encapsulates the second inductor such that each of the plurality of second substrate inductance loops is in direct contact with the second substrate.

2. The stacked substrate inductor of claim 1,
   wherein the first substrate is an interposer substrate, and
   wherein the second substrate is a die substrate.

3. The stacked substrate inductor of claim 1, wherein the first inductor and the second inductor are both looped substantially in a rectangle.

4. The stacked substrate inductor of claim 1, wherein the first inductor and the second inductor are both looped substantially in a spiral.

5. The stacked substrate inductor of claim 1, further comprising a magnetic core in the first and second core regions.

6. The stacked substrate inductor of claim 1, further comprising a third inductor within the second substrate,
   wherein a core region of the third inductor is a third core region, and
   wherein at least a portion of the third core region overlaps with at least a portion of the first core region.

7. The stacked substrate inductor of claim 6,
   wherein each of the second and third inductors is electrically in series with the first inductor, and
   wherein the second and third inductors are electrically in parallel with each other.

8. The stacked substrate inductor of claim 6, wherein there is no overlap between the second and third core regions.

9. The stacked substrate inductor of claim 1,
   wherein the first inductor comprises one or more first substrate inductance loops, or
   wherein the second inductor comprises one or more second substrate inductance loops, or both.

10. The stacked substrate inductor of claim 9,
    wherein when the first inductor comprises a plurality of first substrate inductance loops, each pair of adjacent first substrate inductance loops are configured to be electrically coupled by a corresponding first substrate loop interconnect, and
    wherein when the second inductor comprises a plurality of second substrate inductance loops, each pair of adjacent second substrate inductance loops are configured to be electrically coupled by a corresponding second substrate loop interconnect.

11. The stacked substrate inductor of claim 9,
    wherein when the first inductor comprises a plurality of first substrate inductance loops, none of the plurality of first substrate inductance loops is circumscribed by another of the plurality of first substrate inductance loops at a same level, or
    wherein when the second inductor comprises a plurality of second substrate inductance loops, none of the plurality of second substrate inductance loops is circumscribed by another of the plurality of second substrate inductance loops at a same level, or both.

12. A device package, comprising:
a first substrate;
a second substrate stacked on the first substrate such that an upper side of the first substrate is in direct contact with a lower side of the second substrate;
a first inductor within and in direct contact with the first substrate, the first inductor including a first core region;
a die and a second inductor within and in direct contact with the second substrate, the second inductor including a second core region;
an inductor interconnect within and in direct contact with the second substrate, the inductor interconnect configured to electrically couple the first inductor with the second inductor,
wherein at least a portion of the first core region overlaps with at least a portion of the second core region,
wherein the second inductor comprises a plurality of second substrate inductance loops, and
wherein the second substrate encapsulates the second inductor and the die such that each of the plurality of second substrate inductance loops is in direct contact with the second substrate and the die is in direct contact with the second substrate.

13. The device package of claim 12,
wherein when the first inductor comprises a plurality of first substrate inductance loops, each pair of adjacent first substrate inductance loops configured to be electrically coupled by a corresponding first substrate loop interconnect, and
wherein when the second inductor comprises a plurality of second substrate inductance loops, each pair of adjacent second substrate inductance loops configured to be electrically coupled by a corresponding second substrate loop interconnect.

14. The device package of claim 12,
wherein when the first inductor comprises a plurality of first substrate inductance loops, none of the plurality of first substrate inductance loops is circumscribed by another of the plurality of first substrate inductance loops at a same level, or
wherein when the second inductor comprises a plurality of second substrate inductance loops, none of the plurality of second substrate inductance loops is circumscribed by another of the plurality of second substrate inductance loops at a same level, or
both.

15. The device package of claim 12,
wherein the first inductor is shaped to be adjacent to a periphery of first and second sides of the die, or
wherein the second inductor is shaped to be adjacent to the periphery of first and second sides of the die, or
both.

16. The device package of claim 12,
wherein the first substrate is an interposer substrate, and
wherein the second substrate is a die substrate.

17. The device package of claim 12, wherein a height of the second inductor is less than or substantially equal to a height of the die.

18. The device package of claim 12, wherein the first inductor and the second inductor are both looped substantially in a rectangle.

19. The device package of claim 12, wherein the first inductor and the second inductor are both looped substantially in a spiral.

20. The device package of claim 12, further comprising a magnetic core in the first and second core regions.

21. The device package of claim 12, further comprising a third inductor within the second substrate,
wherein a core region of the third inductor is a third core region, and
wherein at least a portion of the third core region overlaps with at least a portion of the first core region.

22. The device package of claim 21,
wherein the first inductor is adjacent to a periphery of first and second sides of the die,
wherein the second inductor is adjacent to the periphery of the first side of the die, and
wherein the third inductor is adjacent to the periphery of the second side of the die.

23. The device package of claim 21,
wherein each of the second and third inductors is electrically in series with the first inductor, and
wherein the second and third inductors are electrically in parallel with each other.

24. The device package of claim 21, wherein there is no overlap between the second and third core regions.

25. A stacked substrate inductor, comprising:
a first substrate;
a second substrate stacked on the first substrate such that an upper side of the first substrate is in direct contact with a lower side of the second substrate;
means for providing a first inductance within and in direct contact with the first substrate, the means for providing the first inductance including a first core region;
means for providing a second inductance within and in direct contact with the second substrate, the means for providing the second inductance including a second core region;
means for providing an interconnect for electrically coupling the means for providing the first inductance with the means for providing the second inductance,
wherein the means for providing the interconnect is within and in direct contact with the second substrate,
wherein at least a portion of the first core region overlaps with at least a portion of the second core region,
wherein the means for providing the second inductance comprises means for providing a plurality of second loop inductances, and
wherein the second substrate encapsulates the means for providing the second inductance such that each of the plurality of second loop inductances is in direct contact with the second substrate.

26. The stacked substrate inductor of claim 25, further comprising a magnetic core in the first and second core regions.

27. The stacked substrate inductor of claim 25, further comprising means for providing a third inductance within the second substrate;
wherein a core region of the means for providing the third inductance is a third core region,
wherein at least a portion of the third core region overlaps with at least a portion of the second core region, and
wherein there is no overlap between the second and third core regions.

28. The stacked substrate inductor of claim 27,
wherein the means for providing the second inductance is electrically in series with the means for providing the first inductance,
wherein the means for providing the third inductance is electrically in series with the means for providing the first inductance, and wherein the means for providing the second inductance is electrically in parallel with the means for providing the third inductance.

* * * * *